(12) United States Patent
Xu et al.

(10) Patent No.: US 8,315,306 B2
(45) Date of Patent: *Nov. 20, 2012

(54) DISTRIBUTED JOINT SOURCE-CHANNEL CODING OF VIDEO USING RAPTOR CODES

(75) Inventors: Qian Xu, College Station, TX (US); Vladimir M. Stanković, Lancaster (GB); Zixiang Xiong, Spring, TX (US)

(73) Assignee: The Texas A&M University System, College Station, TX (US)

( * ) Notice: Subject to any disclaimer, the term of this patent is extended or adjusted under 35 U.S.C. 154(b) by 1435 days.

This patent is subject to a terminal disclaimer.

(21) Appl. No.: 11/517,942

(22) Filed: Sep. 8, 2006

(65) Prior Publication Data

US 2008/0069242 A1 Mar. 20, 2008

(51) Int. Cl.
*H04N 7/12* (2006.01)
(52) U.S. Cl. .................................. 375/240.03
(58) Field of Classification Search .................. None
See application file for complete search history.

(56) References Cited

U.S. PATENT DOCUMENTS 5,499,254 A 3/1996 Ikekawa et al.
7,746,758 B2 6/2010 Stolpman

OTHER PUBLICATIONS

Xu, Qian, et al., "Distributed Joint Source-Channel Coding of Video Using Raptor Codes," IEEE Proceedings of the 2005 Data Compression Conference; Published Mar. 14, 2005, 1 pg.
Xu, Qian, et al., "Distributed Joint Source-Channel Coding of Video," IEEE Proceedings of International Conference on Image Processing (ICIP'05); Published Sep. 11, 2005; 4 pgs.
Xu, Qian, et al., "Layered Wyner-Ziv Video Coding," Proceedings VCIP'04: Special Session on Multimedia Technologies for Embedded Systems; Published Jan. 2004; 9 pgs.
A. Shokrollahi, "Raptor codes," IEEE Trans. Inform. Theory, vol. 52, pp. 2551-2567, Jun. 2006.
N. Rahnavard and F. Fekri, "Finite-Length Unequal Error Protection Rateless Codes: Design and Analysis," Proc. IEEE Globecom-2005; Saint Louis, MO; Nov. 2005.
A. Aaron and B. Girod, "Compression with side information using turbo codes," in Proc. DCC-2002 Data Compression Conference, Snowbird, UT, Apr. 2002.
A. D. Liveris, Z. Xiong, and C. Georghiades, "Joint source-channel coding of binary sources with side information at the decoder using IRA codes," in Proc. Multimedia Signal Processing Workshop, St. Thomas, US Virgin Islands, Dec. 2002.
A. Sehgal, A. Jagmohan, and N. Ahuja, "Wyner-Ziv Coding of Video: An Error-Resilient Compression Framework," IEEE Trans. Multimedia, vol. 6, pp. 249-258, Apr. 2004.

(Continued)

*Primary Examiner* — Jay Au Patel
*Assistant Examiner* — Richard Torrente
(74) *Attorney, Agent, or Firm* — Knobbe, Martens, Olson & Bear LLP

(57) ABSTRACT

A video encoder system includes a base layer and an enhancement layer for encoding video data. The base layer encodes a reduced quality version of the video data to obtain base layer data. The enhancement layer encodes the video data using energy-concentrating transform operations, nested scalar quantization, and Raptor encoders. The base layer data and enhancement layer data are transmitted through a channel to a video decoder system. The decoder system decodes the base layer data to recover an estimate of the reduced quality video and decodes the enhancement layer data (using the reduced quality video as side information) to obtain blocks of coset indices. The decoder system then operates on the blocks of coset indices to generate estimates of the original video data.

36 Claims, 6 Drawing Sheets

OTHER PUBLICATIONS

A. Wyner and J. Ziv, "The rate-distortion function for source coding with side information at the decoder," IEEE Trans. Inform. Theory, vol. 22, pp. 1-10, Jan. 1976.

A. Wyner, "Recent results in the Shannon theory," IEEE Trans. Inform. Theory, vol. 20, pp. 2-10, Jan. 1974.

B. Girod, A. Aaron, S. Rane, and D. Rebolio-Monedero, "Distributed video coding," Proc. of the IEEE, vol. 93, pp. 71-83, Jan. 2005.

C. E. Shannon, "A mathematical theory of communication," Bell Syst. Tech. J., vol. 27, pt. I, pp. 379-423, 1948; pt. II, pp. 623-656, 1948.

D. Slepian and J.K. Wolf, "Noiseless coding of correlated information sources," IEEE Trans. Inform. Theory, vol. 19, pp. 471-480, Jul. 1973.

G.D. Forney Jr., "Coset codes-I: Introduction and geometrical classification," IEEE Trans. Inform. Theory, vol. 34, pp. 1123-1151, Sep. 1988.

G.D. Forney Jr., "Coset codes-II: Binary lattices and related codes," IEEE Trans. Inform. Theory, vol. 34, pp. 1152-1187, Sep. 1988.

H. Jin, A. Khandekar, and R. McEliece, "Irregular repeat-accumulate codes," in Proc. 2nd Int. Symp. on Turbo codes, Brest, France, Sep. 2000.

J. Garcia-Frias. "Joint source-channel decoding of correlated sources over noisy channels," in Proc. DCC-2001 Data Compression Conference, Snowbird, UT, Mar. 2001.

M. Gastpar, P. Dragotti, and M. Vetterli, "The distributed Karhunen-Loueve transform," submitted to IEEE Trans. Inform. Theory, Nov. 2004.

P. Mitran and J. Bajcsy, "Turbo source coding: A noise-robust approach to data compression," in Proc. DCC-2002 Data Compression Conference, Snowbird, UT, Apr. 2002.

Q. Xu and Z. Xiong, "Layered Wyner-Ziv video coding," submitted to IEEE Trans. Image Processing, Jul. 2004.

Q. Xu, V. Stankovic, A.D. Liveris, and Z. Xiong, "Distributed joint source-channel coding of video," to appear in Proc. ICIP-2005 IEEE International Conference on Image Processing, Genova, Italy, Sep. 2005.

R. Puri and K. Ramchandran, "PRISM: A New Robust video coding architecture based on distributed compression principles," submitted to IEEE Trans. Image Processing, 2003.

R. Zamir, S. Shamai, and U. Erez, "Nested linear/lattice codes for structured multiterminal binning," IEEE Trans. Inform. Theory, vol. 48, pp. 1250-1276, Jun. 2002.

S. Cheng and Z. Xiong, "Successive refinement for the Wyner-Ziv problem and layered code design," in Proc. DCC-2004 Data Compression Conference, Snowbird, UT, Apr. 2004.

S. Pradhan, J. Kusuma, and K. Ramchandran, Distributed compression in a dense microsensor network: IEEE Signal Processing Magazine, vol. 19, pp. 51-60, Mar. 2002.

S. Shamai, S. Verdu, and R. Zamir, "Systematic lossy source/channel coding," IEEE Trans. Inform. Theory, vol. 44, pp. 564-579, Mar. 1998.

S.-Y. Chung, On the Construction of Some Capacity-Approaching Coding Schemes, Ph.D. dissertation, Massachusetts Institute of Technology, 2000.

V. Stankovic, A. Liveris, Z. Xiong, and C. Georghiades, "Design of Slepian-Wolf codes by channel code partitioning," in Proc. DCC-2004 Data Compression Conference, Snowbird, UT, Mar. 2004.

V. Stankovic, A. Liveris, Z. Xiong, and C. Georghiades, "On code design for the Slepian-Wolf Problem and Lossless Multiterminal networks" IEEE transactions on information theory, vol. 52, N04, Apr. 2006 pp. 1495-1570.

W. Li, "Overview of fine granularity scalability in MPEG-4 video standard", IEEE Trans. Circuits and Systems for Video Tech., vol. 11, pp. 301-317, Mar. 2001.

Y. Sterinberg and N. Merhav, "On successive refinement for the Wyner-Ziv problem," IEEE Trans. Inform. Theory, vol. 50, pp. 1636-1654, Aug. 2004.

Z. Xiong, A. Liveris, and S. Cheng, "Distributed source coding for sensor networks," IEEE Signal Processing Magazine, vol. 21, pp. 80-94, Sep. 2004.

Z. Xiong, A. Liveris, S. Cheng, and Z. Liu, "Nested quantization and Slepian-Wolf coding: A Wyner-Ziv coding paradigm for i.i.d. sources," in Proc. IEEE Workshop on Statistical Signal Processing, St. Louis, MO, Sep. 2003.

DISTRIBUTED JOINT SOURCE-CHANNEL CODING OF VIDEO USING RAPTOR CODES

STATEMENT OF U.S. GOVERNMENT LICENSING RIGHTS

The U.S. Government has a paid-up license in this invention and the right in limited circumstances to require the patent owner to license others on reasonable terms as provided for by the terms of grant number CCF 04-30720 awarded by the National Science Foundation (NSF).

FIELD OF THE INVENTION

The present invention relates generally to the field of video transmission, and more specifically, to the field of scalable video coding.

DESCRIPTION OF THE RELATED ART

Multimedia communication over wireless networks has generated a lot of research interests in the past decade. Its main challenge lies in limited network bandwidth and the requirement of real-time playback on one hand, and severe impairments of wireless links on the other. The additional issue has to do with the time-varying nature of wireless links and network heterogeneity, which make the channels between the sender and the clients extremely diverse in their available bandwidths and packet loss rates. These diverse transmission conditions and bandwidth scarcity call for efficient scalable multimedia compression. Indeed, scalable video coding is expected to play a pivotal role in many emerging multimedia applications such as video broadcast/multicast over third generation (3G) wireless networks, interactive video, and wireless video surveillance networks. However, a scalable bitstream is usually very sensitive to channel noise as it suffers from error propagation. This is a limiting factor in their practical employment since wireless communication links are unreliable. Therefore, a robust scalable video coder is needed. Although standard video coders (e.g., H.264) can offer high coding efficiency in the scalable mode, they are very sensitive to packet loss, which results in error propagation/drifting.

SUMMARY

Various embodiments described herein are addressed to the problem of distributed source-channel coding and aim at the important application of scalable video transmission over wireless networks. In these embodiments, a single channel code may be used for both video compression (via Slepian-Wolf coding) and packet loss protection. In this specification, we provide a theoretical code design framework for distributed joint source-channel coding over erasure channels and then apply the framework to the targeted video application. In some embodiments, the resulting video coder is based on a cross-layer design where video compression and protection are performed jointly. Raptor codes—the best approximation to a digital fountain—may be used to perform the joint source-channel coding. We address in detail both encoder and decoder designs. Using the received packets together with a correlated video available at the decoder as side information, we devise a new iterative soft-decision decoder for joint Raptor decoding. Simulation results show that, compared to one separate design using Slepian-Wolf compression plus erasure protection and another based on fine granular scalability (FGS) coding plus erasure protection, our joint design provides better video quality at the same number of received packets.

BRIEF DESCRIPTION OF THE DRAWINGS

The following detailed description makes reference to the accompanying drawings, which are now briefly described.

While the invention is described herein by way of example for several embodiments and illustrative drawings, those skilled in the art will recognize that the invention is not limited to the embodiments or drawings described. It should be understood, that the drawings and detailed description thereto are not intended to limit the invention to the particular form disclosed, but on the contrary, the intention is to cover all modifications, equivalents and alternatives falling within the spirit and scope of the present invention as defined by the appended claims. The headings used herein are for organizational purposes only and are not meant to be used to limit the scope of the description or the claims. As used throughout this specification, the word "may" is used in a permissive sense (i.e., in the sense of "having the potential to"), rather than in the mandatory sense (i.e., in the sense of "must"). Furthermore, the phrase "A includes B" is used to mean "A includes B, but is not limited to B".

DETAILED DESCRIPTION OF THE PREFERRED EMBODIMENTS

U.S. patent application Ser. No. 11/494,678, filed on Jul. 27, 2006, entitled "Layered Wyner-Ziv Video Coding for Transmission over Unreliable Channels", invented by Qian Xu, Vladimir Stankovic and Zixiang Xiong, is hereby incorporated by reference in its entirety.

Please note that a list of references is included at the end of this detailed description. The notation "[n]" is to be interpreted as a reference to the $n^{th}$ reference in the list of references.

Figure 1A:
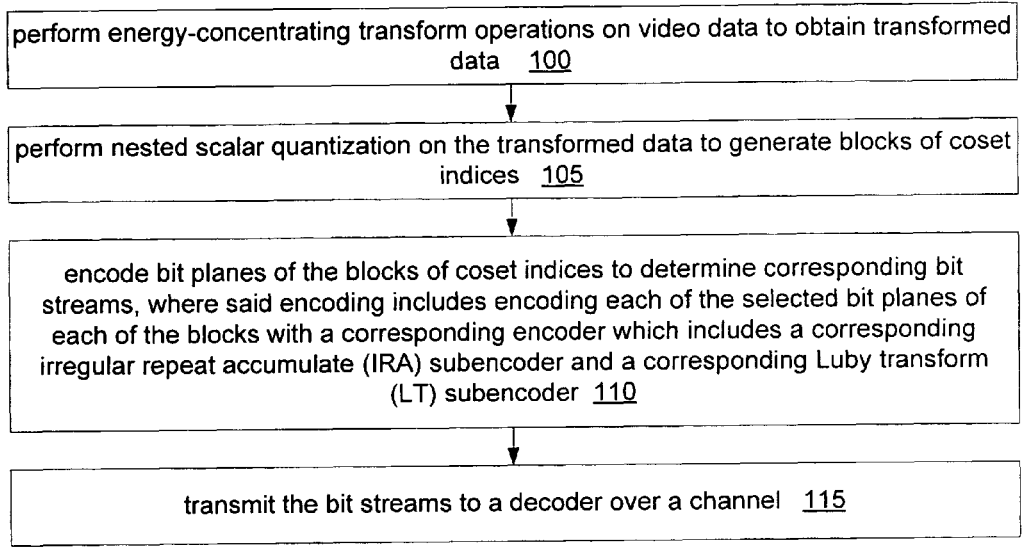
FIG. 1A illustrates one embodiment of a method for encoding video data.

In one set of embodiments, a method for encoding video data may involve the following actions, as illustrated in FIG. 1A.

At 100, energy-concentrating transform operations may be performed on video data to obtain transformed data. In some embodiments, energy-concentrating transform operations may be discrete cosine transform (DCT) operations. In other embodiments, the energy-concentrating transform operations may be conditional Karhunen-Loève transform operations.

At 105, nested scalar quantization may be performed on the transformed data to generate blocks of coset indices.

The transformed data may be organized as blocks of transform coefficients. For example, a first block may include the C(0,0) coefficient (i.e., the DC coefficient) from each macroblock of a collection of frames of the video data, where C(i,j) denotes the coefficient at the $i^{th}$ row and $j^{th}$ column of a macroblock. A second block may include the C(0,1) coefficient from each macroblock of the collection of frames. A third block may include the C(1,0) coefficient from each macroblock of the collection of frames. In one set of embodiments, the nested scalar quantization may quantize the blocks of transform coefficients. For example, under the assumption that the binary representation of a given block has M bit planes, the nested scalar quantization may throw away the $(M-\log_2(N)-\log_2(q))$ most significant bit planes and the $\log_2(q)$ least significant bit planes of the block, retaining the group of $\log_2(N)$ contiguous bit planes of the block. N and q are both powers of 2.

Please refer to U.S. patent application Ser. No. 11/494,678 for examples of how actions 100 and 105 may be performed.

At 110, bit planes of the blocks of coset indices may be encoded in order to determine corresponding bit streams. The encoding process may include encoding each of the bit planes of each of the blocks with a corresponding encoder which includes a corresponding irregular repeat accumulate (IRA) subencoder and a corresponding Luby transform (LT) subencoder. Please see section 4.1 below for information on how to design the IRA subencoder and the Luby transform subencoder.

At 115, the bit streams (or some subset of the bit streams) may be transmitted to a decoder over a channel. Furthermore, different subsets of the bit streams may be transmitted to different decoders over different channels. For example, a server configured to perform the method embodiment of FIG. 1A may send all of the bit streams to a high-bandwidth client and some subset of the bit streams to the lower bandwidth client.

As an alternative to 115, the bit streams may be stored in a memory medium, and then accessed from the memory medium and decoded at some later time.

In some embodiments, each LT encoder is characterized by a corresponding graph having input nodes and output nodes. (For example, the right-hand portion of FIG. 4A corresponds to an LT subencoder. The input nodes to the LT graph are along the column denoted B, and the output nodes of the LT graph are along the column denoted C.) A first subset of the input nodes receive bits from the corresponding bit plane of the corresponding block. The second subset of the input nodes receive parity bits from the corresponding IRA subencoder. Each of the output nodes has a collection of connections terminating on the output node and originating from selected ones of the input nodes. The rate of the IRA subencoder and a "connection weight" of the LT subencoder have been jointly optimized to minimize the data size of the bit streams required for correct decoding at the decoder. Please see section 4.1 below for description of the optimization process. The connection weight represents a fraction of the connections of said collection that originate from the second subset (i.e., the parity subset) of input nodes. In FIG. 4A, the second subset of input nodes are the nodes denoted as $v_j$, j=1, 2, ..., (n−k). The connection weight is greater than 0.5.

In some embodiments, each of the IRA subencoders is configured to perform both source coding and error protection coding on the corresponding bit plane of the corresponding block of coset indices, wherein the channel is a noisy channel. Please refer to section 4.1 below for information on how the IRA subencoder can be designed to perform these two purposes simultaneously.

Figure 3:
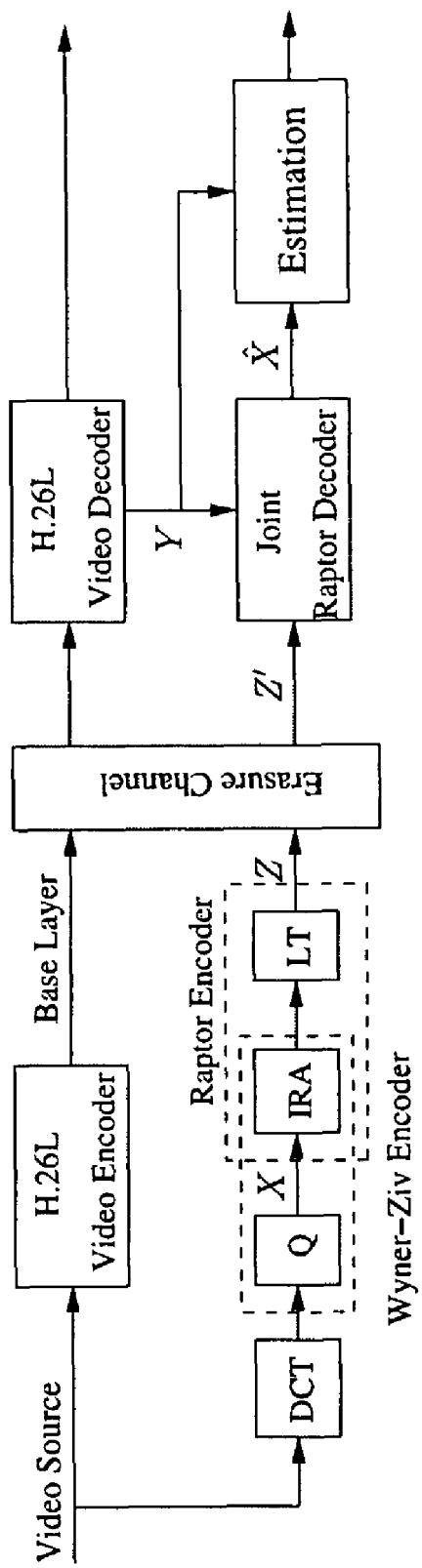
FIG. 3 is a block diagram illustrating one embodiment of a video encoder with a base layer and enhancement layer. "Q" stands for quantization.

In some embodiments, the method may further involve: encoding a version V of the video data to obtain base layer data, where the version V has a lower image quality than the video data itself; and transmitting the base layer data to the decoder over the channel. Any of various standard or non-standard video encoders may be used to encode the version V. FIG. 3 illustrates an example where an H.26L encoder is used to encode the version V. In one alternative embodiment, the video encoder is an MPEG encoder.

The decoder may receive the base layer data (perhaps corrupted by packet losses) and recover an estimate of the version V from the base layer data. The decoder may use this recovered estimate of the version V as side information in the decoding process.

In some embodiments, the action of transmitting the bit streams includes transmitting the bit streams onto a computer network such as a local area network, a wide area network or the Internet.

In some embodiments, a video encoding system may be configured to include a transform unit, a quantization unit, and an encoding unit $E_{enh}$ configured to respectively perform actions 100, 105 and 110 as described above. The video encoding system may also include a transmitter configured to transmit the bit streams over a channel.

The video encoding system may be realized in any of various forms. For example, in one embodiment, the video encoding system may be realized in terms of dedicated circuitry such as one or more application specific integrated circuits (ASIC). As another embodiment, the video encoding system may be realized using one or more programmable devices such as processors and/or field programmable gate arrays (FPGAs). In yet another set of embodiments, the video encoding system may be realized as a combination of dedicated circuitry and one or more programmable devices.

The video encoding system may also include an encoding unit $E_{base}$ configured to encode a version V of the video data to obtain base layer data, where the version V has a lower image quality than the video data itself. The transmitter may also be configured to transmit the base layer data to the destination device over the channel.

Figure 1B:
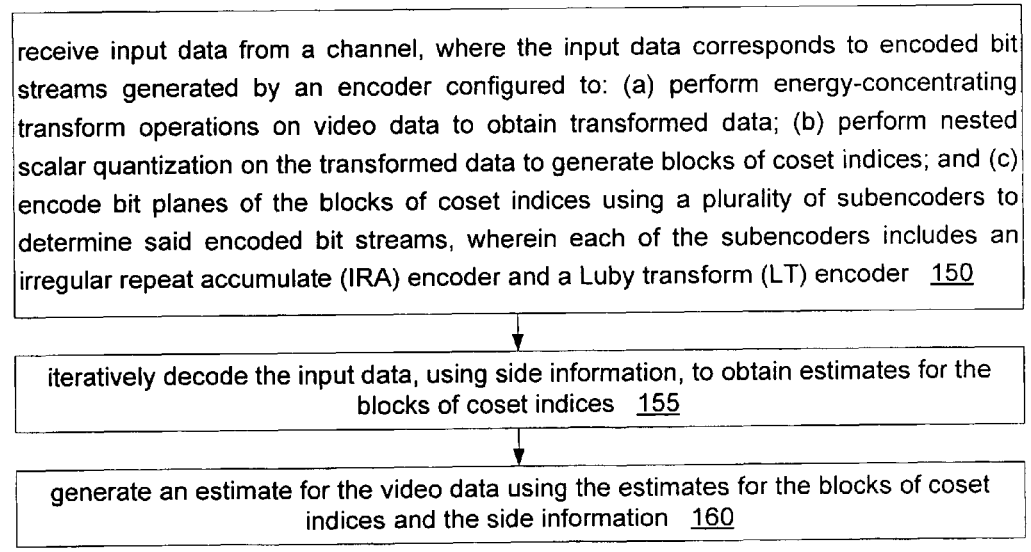
FIG. 1B illustrates one embodiment of a method for recovering video data from encoded input data.

In one set of embodiments, a method for recovering video data from received input data may be involve the following actions, as illustrated in FIG. 1B.

At 150, input data may be received from a channel. The input data corresponds to encoded bit streams generated by an encoder configured to: (a) perform energy-concentrating transform operations on video data to obtain transformed data; (b) perform nested scalar quantization on the transformed data to generate blocks of coset indices; and (c) encode bit planes of the blocks of coset indices using a plurality of subencoders to determine said encoded bit streams, wherein each of the subencoders includes an irregular repeat accumulate (IRA) encoder and a Luby transform (LT) encoder.

At 155, the input data may be iteratively decoded using side information. The iterative decoding produces estimates for the blocks of coset indices. In some embodiments, portions of the input data corresponding to separate blocks of the coset indices may be decoded in parallel. However, the decoding of each portion of the input data may be performed in a progressive fashion. Please refer to U.S. Patent Application for more description along these lines.

At 160, an estimate for the video data may be generated using the estimates for the blocks of coset indices and the side information. The video data may be presented to a display device used to drive a display device (e.g., a monitor, a video projector, a head-mounted display, etc.)

In some embodiments, the iterative decoding process uses a plurality of graphs, where each of the graphs corresponds to one of the subencoders. Each of the graphs includes input nodes and output nodes and no intermediate nodes. The input nodes are directly connected to the output nodes. FIG. 4B illustrates one example of such a graph.

In some embodiments, the method may also involve: receiving base layer data from the channel; and decoding the base layer data to obtain the side information. The video decoder used to decode the base layer data may be any of various standard or nonstandard video decoders. For example, in FIG. 3, the video decoder is an H.26L decoder.

In some embodiments, a video decoding system may include a decoding unit $D_{enh}$ and an estimation unit configured to respectively perform actions 155 and 160 as described above. The video decoding system may also include a receiver unit configured to perform action 150.

The video decoding system may be realized in any of various forms. For example, in one embodiment, the video decoding system may be realized in terms of dedicated circuitry such as one or more application specific integrated circuits (ASIC). As another embodiment, the video decoding system may be realized using one or more programmable devices such as processors (configured to execute stored program instructions) and/or field programmable gate arrays (FPGAs). In yet another set of embodiments, the video decoding system may be realized as a combination of dedicated circuitry and one or more programmable devices.

The video decoding system may also include a decoding unit $D_{base}$ configured to decode base layer data in order to recover the side information. The receiver unit may also be configured to receive the base layer data from the channel and provide the base layer data to the decoding unit $D_{base}$.

In some embodiments, a computer-readable memory medium may be configured to store program instructions, where the program instructions are executable to implement method X, where method X is any of the method embodiments described herein (or any combination of the method embodiments described herein).

A memory medium is a medium configured for the storage of information. Examples of memory media include various kinds of magnetic media (e.g., magnetic tape, magnetic disk, magnetic strips, and magnetic film); various kinds of optical media (e.g., CD-ROM); various kinds of semiconductor RAM and ROM; and various media based on the storage of electrical charge and/or other physical quantities; etc.

In some embodiments, a computer system may be configured to include a processor and a memory medium. The memory medium may be configured to store program instructions. The processor may be configured to read and execute the program instructions. The program instructions may be executable to implement method X, wherein method X is any of the method embodiments described herein (or any combination of the method embodiments described herein). The computer system may be realized in any of various forms. For example, the computer system may be a personal computer (in any of its various forms), a computer on a card, a server computer, a client computer, a computer system embedded in a sensor device, etc.

Figure 2:
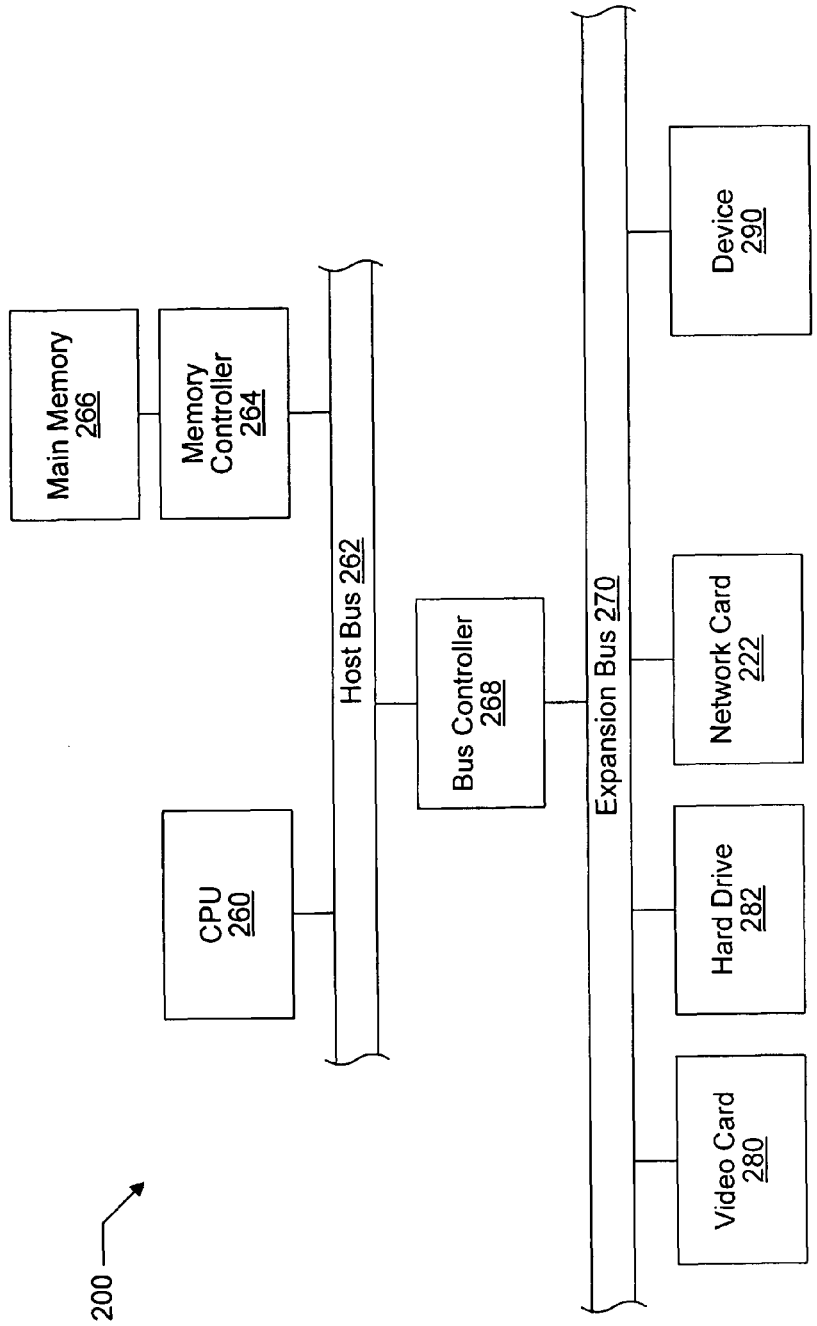
FIG. 2 illustrates one embodiment of a computer system suitable for performing any of the encoding and/or decoding methods described herein.

FIG. 2 is a block diagram representing one embodiment of a computer system 200 suitable for executing any of the various method embodiments described herein. The computer system may include at least one central processing unit CPU 260 which is coupled to a host bus 262. The CPU 260 may be any of various types, including, but not limited to, an x86 processor, a PowerPC processor, a CPU from the SPARC family of RISC processors, as well as others. A memory medium, typically including RAM, and referred to as main memory 266, may be coupled to the host bus 262 by means of a memory controller 264. The main memory 266 may store programs operable to implement method X, where method X is any of the method embodiments described herein (or any combination of the method embodiments described herein). The main memory may also store operating system software, as well as other software for operation of the computer system.

The host bus 262 may couple to an expansion or input/output bus 270 through a bus controller 268 or bus bridge logic. The expansion bus 270 may be the PCI (Peripheral Component Interconnect) expansion bus, although other bus types can be used. The expansion bus 270 includes slots for various devices such as a video card 280, a hard drive 282, a CD-ROM drive (not shown) and a network interface 222. The network interface 222 (e.g., an Ethernet card) may be used to communicate with other computers through a network (e.g., the Internet).

The computer system may serve as a video encoding system and/or as a video decoding system. The encoded bit streams may be transmitted and/or received through the network interface 222.

In some embodiments, the computer system 82 may include input devices (not shown) such as a mouse and a keyboard, and output devices (not shown) such as a display device and speakers. The display device may couple to the computer system through the video card 280.

In some embodiments, the computer system may also couple to a video camera. In one embodiment, the computer system may encode video data received from the video camera.

In one embodiment, a device 290 may also be connected to the computer system. The device 290 may include an embedded processor and memory. The computer system may be operable to transfer a program to the device 290 for execution of the program on the device 290. The program may be configured to implement method X, where method X is any of the method embodiments described herein (or any combination of the method embodiments described herein). In one alternative embodiment, the device 290 may include an FPGA. The computer system may download programming information to the device in order to effect programming of the FPGA. The programming information enables the FPGA to implement method X, where method X is any of the method embodiments described herein (or any combination of the method embodiments described herein).

1 Introduction

Multimedia communication over wireless networks has generated a lot of research interest in the past decade. Its main challenge lies in limited network bandwidth and the requirement of real-time playback on the one hand, and severe impairments of wireless links on the other. The additional issue has to do with the time-varying nature of wireless links and network heterogeneity, which make the channels between the sender and the clients extremely diverse in their available bandwidths and packet loss rates. These diverse transmission conditions and bandwidth scarcity call for efficient scalable multimedia compression. Indeed, scalable video coding is expected to play a pivotal role in many emerging multimedia applications such as video broadcast/multicast over third generation (3G) wireless networks, interactive video, and wireless video surveillance networks. However, a scalable bitstream is usually very sensitive to channel noise as it suffers from error propagation. This is a limiting factor in their practical employment since wireless communication links are unreliable. Therefore, a robust scalable video coder is needed. Although standard video coders (e.g., H.264 [2]) can offer high coding efficiency in the scalable mode, they are very sensitive to packet loss, which results in error propagation/drifting.

Motivated by its potential applications in distributed sensor networks [3], video coding [4, 5, 6, 7], and compressing multi-spectral imagery [8], there has been a flurry of research activities on distributed source coding [3, 9] (e.g., Slepian-Wolf coding [10], Wyner-Ziv coding [11], and multiterminal source coding [12]) recently. For example, several efficient Slepian-Wolf coding (SWC) and Wyner-Ziv coding (WZC) schemes have been developed based on advanced channel coding for distributed compression (see [3, 9, 13] and references therein). Moreover, Wyner-Ziv video coding [4, 5, 6, 7] has been proposed as a promising new technique. For example, a scalable video coder based on successive refinement for the Wyner-Ziv problem [14] was presented in [7], where a standard decoded base layer was used as the decoder side information, and a layered Wyner-Ziv bitstream of the original video sequence is generated to enhance the base layer.

The main advantage of Wyner-Ziv video coding over standard video coding (e.g., MPEG-4 FGS [15]) lies in error robustness. Specifically, the MPEG-4 FGS encoder generates the enhancement layer by coding the difference between the original video and the base layer reconstruction; then the decoder reconstructs the original video by adding an enhancement layer to the recovered base layer. This requires that the base layer recovered at the decoder is identical to that generated at the encoder. Thus, lost symbols in the base layer will cause the loss of synchronization between the encoder and decoder and result in severe error propagation. On the other hand, it is known from [11] that in WZC of quadratic Gaussian sources, separate encoding with joint decoding is as efficient as joint encoding (with the side information being present at both the encoder and decoder). Therefore, with Wyner-Ziv video coding, the enhancement layer can be generated "blindly" at the encoder without using the base layer (as side information). This way, transmission errors in the base layer will less likely cause encoder-decoder mismatch and hence have less impact on the reconstruction. This alleviates the problem of error drifting/propagation associated with FGS coding and makes the Wyner-Ziv video coder robust to errors/erasures in the base layer, as demonstrated in [7]. However, the layered enhancement bitstream is very sensitive to transmission failures, since the channel is assumed to be noiseless in distributed source coding in general and WZC in particular.

Various embodiments described herein consider transporting Wyner-Ziv coded video over packet erasure channels and address distributed source-channel coding. As in classic source-channel coding, separation theorems [16, 17] have been shown to hold asymptotically (e.g., with infinite code length, delay and complexity). We show that distributed joint source-channel coding (JSCC) outperforms separate source-channel coding in practice. Specifically:

We develop a design for distributed JSCC over packet erasure channels by extending beyond the work on SWC [13]. Instead of using separate channel codes for Slepian-Wolf compression in WZC and for protection, we adopt a single channel code for both SWC (i.e., compression) and erasure protection in a distributed JSCC framework.

We make use of Raptor codes [18, 19] for the new application of distributed JSCC. Raptor codes are the latest addition to a family of low-complexity digital fountain codes [20], capable of achieving near-capacity erasure protection. They are proposed in [18] as precoded LT codes [21], and commonly used with low-density parity-check (LDPC) precoding.

We employ a special class of LDPC codes called irregular repeat-accumulate (IRA) codes [22] as the precode for our Raptor code. The IRA precoder is followed by an LT code which guarantees the rateless property of the overall Raptor code, meaning a limitless stream of packets can be generated by the encoder; thus the decoder can always receive enough packets (in non-delay sensitive applications) for correct decoding, regardless of the packet loss rate.

We state a design goal of our Raptor encoder, which is to minimize the number of packets the decoder has to receive for correct decoding beyond the Slepian-Wolf compression limit. To this end, we vary the rate of the IRA precode and introduce a bias towards selecting the IRA parity bits when making the random connections in forming the sparse-graph of the LT code. This bias is motivated by the fact that a correlated version of the IRA systematic bits is already available as side information at the decoder, and its optimization is embedded in the overall Raptor encoder design.

For the decoder design, due to the presence of decoder side information, we deviate from standard Raptor decoding and devise a new iterative soft-decision decoder that combines the received packets and the side information to perform joint decoding.

Our simulations show that, compared to a separate design using WZC plus additional erasure protection, the proposed design provides better video quality.

In Section 2 we review erasure protection coding techniques ranging from Reed-Solomon (RS) codes to Tornado codes to digital fountain codes to Raptor codes. Section 3 outlines information-theoretical approaches to designing practical codes for the SWC and distributed JSCC problems and points out advantages of a joint source-channel code design over a separate one. Section IV describes one embodiment of our proposed video coder based on Raptor codes. Section 5 presents experimental comparisons between the proposed joint design, one separate design that uses WZC plus additional erasure protection, and another separate channel code design based on FGS source coding.

2 Erasure Protection Coding

In this section, we review erasure protection codes, starting from the well-known RS codes and ending with Raptor codes—the latest in the family of digital fountain codes.
Systematic Reed-Solomon codes: Error protection over packet erasure channels can be realized with capacity-achieving RS codes. RS codes belong to a class of the so-called maximum-distance separable (MDS) codes, meaning that an (n,k) RS code can recover the whole information sequence from any subset of k received symbols (provided that the erasure locations are known). However, the decoding complexity of practical (n,k) RS codes is $O(n^2)$ [24], making them too complex for real-time applications.

Tornado codes: A new class of erasure protection codes, tornado codes, was introduced in [25]. By transmitting just below the channel capacity, hence sacrificing the MDS property, tornado codes can be encoded and decoded with linear complexity.

Digital fountain LT codes: Developed from tornado codes, digital fountain codes [20] are the latest in erasure correction coding. They are sparse-graph codes that are ideally suited for data protection against packet loss; they are rateless, in the sense of allowing a potentially limitless stream of output symbols to be generated for a given input sequence. A decoding algorithm for a fountain code, which can recover with high probability the original k input symbols from any set of n output symbols, has the overhead of $(n-k)/k>0$. (Note that in MDS RS coding the overhead is always zero.) A fountain code is called universal if it has fast encoding and decoding algorithms and the overhead close to zero for any erasure channel with erasure probability less than one. The first practical universal fountain code is LT code [21]. LT coding is based on a Tanner graph connecting encoded symbols (check nodes) to source symbols (information nodes). The encoder generates an output symbol $z_i$ by randomly choosing the degree $d_i$ from a predetermined degree distribution and selecting uniformly at random $d_i$ distinct source symbols from $x_1, \ldots, x_k$; $z_i$ is then set as their XOR sum. The decoder first finds a check node $z_j$ that is connected to only one information node $x_i$, $i \in \{1, \ldots, k\}$, sets $x_i = z_j$, adds $x_i$ to all check nodes that are connected to it, and removes all edges connected to node $x_i$. This procedure is repeating until all information symbols are determined. For any $\delta > 0$, an LT code with the robust soliton distribution [21] can generate each encoded symbol independently on average by $O(\ln(k/\delta))$ symbol operations and recover the k input symbols from any $k + O(\sqrt{k} \ln^2(k/\delta))$ encoded symbols with probability of error $\delta$ after $O(k \cdot \ln(k/\delta))$ symbol operations on average.

Raptor codes: To decrease the encoding complexity, the average degree of the encoded symbols, which is $O(\ln k)$ for LT codes, should be reduced to a constant. Raptor codes [18] realize this goal by introducing a precoding step. Namely, to protect k input symbols, the decoding graph of an LT code must have the order of $k \ln(k)$ edges to ensure that all k input nodes are covered with high probability [21]; hence, one cannot encode at a constant cost if the number of collected output symbols is close to k. To circumvent this, a Raptor code first precodes the k input symbols with a fixed high-rate systematic linear code (e.g., LDPC code). Then the resulting precoded bitstream is fed to the LT encoder. Since now only a fraction of the precoded bitstream is needed for reconstructing the source, the $O(\ln k)$ bound on the average degree no long applies. With an appropriate design [18], for a given integer k and any real $\epsilon > 0$, a Raptor code can produce a potentially infinite stream of symbols such that any subset of symbols of size $k(1+\epsilon)$ is sufficient to recover the original k symbols with high probability. The degree of each encoded symbol is $O(\ln(1/\epsilon))$ and decoding time is $O(k \ln(1/\epsilon))$. Raptor codes currently give the best approximation of a digital fountain [20]. A potentially limitless sequence of packets can be generated on the fly after some small initial preprocessing with a linear encoding complexity. Decoding can be done in linear time after receiving just a few more than k encoding packets. Raptor codes are superior to the best LT codes not only over erasure channels, but also over the binary symmetric and additive white Gaussian noise channels [26].

3 Separate vs. Joint Design for Distributed Source-Channel Coding

In this section, we first give an overview of practical SWC based on channel coding; we then provide extensions to the case when the Slepian-Wolf coded bitstream is transmitted over a packet erasure channel—a scenario that calls for distributed source-channel coding. We present a code design where SWC and erasure protection are done separately and a cross-layer design which performs SWC and erasure protection jointly.

First, a word about notation. Random variables are denoted by capital letters, e.g., X, Y. Realizations of random vectors of finite length n bits are denoted by bold-face lower-case letters, e.g., x, y. Matrices are denoted by bold-face upper-case letters; $I_k$ and $O_{k_1 \times k_2}$ are $k \times k$ identity matrix and $k_1 \times k_2$ all-zero matrix, respectively. All variables and channel codes are binary.

Let $\{X_i, Y_i\}_{i=1}^{\infty}$ be a sequence of independent drawings of a pair of independent, identically distributed (i.i.d.), discrete, correlated random variables (X, Y). It is convenient to model the correlation between X and Y by a "virtual" correlation channel: $X = Y + N$, where the random variable N is the correlation channel noise that is independent of Y.

3.1 Practical Slepian-Wolf Coding

SWC is concerned with compressing X and Y separately and transmitting the resulting bitstreams over a noiseless channel to the receiver for joint decoding. The Slepian-Wolf theorem [10] asserts that if X and Y are compressed at rates $R_X$ and $R_Y$, respectively, where $R_X \geq H(X|Y)$, $R_Y \geq H(Y|X)$, and $R_X + R_Y \geq H(X, Y)$, then the joint decoder can recover them near losslessly. In the sequel, we only focus on the special case, known as source coding with side information, where Y is perfectly known at the decoder as side information. This case can be viewed as approaching the corner point ($R_X$, $R_Y$) = (H(X|Y), H(Y)) on the Slepian-Wolf bound. The achievability of the Slepian-Wolf bound is based on random binning and hence it is nonconstructive. We review next two approaches proposed for practical SWC based on structured (or algebraic) binning [27].

Using the idea of Slepian and Wolf, Wyner [28] outlined a constructive binning scheme using channel codes for SWC, where each bin is a coset of a good parity-check code indexed by its syndrome. To compress source $X^n$, a syndrome-based encoder employs a linear (n, k) channel code C, given by its generator matrix $G_{k \times n} = [I_k \ P_{k \times (n-k)}]$. (For simplicity we assume that C is systematic.) The corresponding $(n-k) \times n$ parity matrix is given by $H = [P_{k \times (n-k)}^T \ I_{n-k}]$. Then, the encoder forms an $(n-k)$-length syndrome vector $s = xH^T$ and sends it to the decoder. The decoder generates an n-length vector $t = [O_{1 \times k} \ s]$ by appending k zeros to the received syndrome. Note that $c = x \oplus t$ is a valid codeword of C, where $\oplus$ denotes the XOR operator. By decoding $t \oplus y$ on C, a codeword $\hat{c}$ is obtained, and the source is reconstructed as $\hat{x} = \hat{c} \oplus t$. To satisfy the Slepian-Wolf limit, $R_X \geq H(X|Y)$, one must ensure $$\frac{k}{n} \leq 1 - H(X|Y).$$

The syndrome-based approach [28] is optimal for SWC, since if the code C approaches the capacity of the "virtual" correlation channel $X = Y + N$, it also approaches the Slepian-Wolf limit.

In the above approach, each bin is indexed by a syndrome of a channel code. However, one can instead use parity-check bits to index the bins. We call this approach parity-based binning. To compress source $X^n$, a parity-based encoder employs a linear (n+r, n) systematic channel code $C^p$ with generator matrix $G^p_{n\times(n+r)}=[I_n\ P^p_{n\times r}]$. The encoder forms an r-length parity vector as $p=xP^p$ and transmits it to the decoder. The decoder generates an (n+r)-length vector $t^p=[y_{1\times n}\ p]$, and by decoding $t^p$ on $C^p$, it obtains $\hat{c}^p=\hat{x}G^p$, whose systematic part is the source reconstruction $\hat{x}$. If the code $C^p$ approaches the capacity of the "virtual" correlation channel, it also approaches the Slepian-Wolf limit. The Slepian-Wolf theorem mandates that $r\geq nH(X|Y)$. To achieve the same amount of compression with both the syndrome- and parity-based approaches, the code rates of the employed codes C and $C^p$ should be such that r=n−k. Then the two approaches are equivalent and generate the same encoder output if $H^T=P^p$. However, note that the parity-based approach has to employ a code with longer length, resulting in increased design complexity while not improving the compression efficiency. We thus conclude that for the SWC problem, in which the compressed bitstream is assumed to be conveyed to the joint decoder via a noiseless transmission channel, the syndrome-based approach is a better choice.

3.2 Transmission Over Packet Erasure Channels

When the transmission channel for conveying the Slepian-Wolf compressed bitstream is noisy, source-channel coding (with decoder side information) is needed. This gives rise to the problem of distributed source-channel coding. The classic separation theorem [29] put forth by Shannon in 1948 for point-to-point communications implicitly states that reliable transmission can be accomplished by separate source and channel coding. The separation theorem in distributed source-channel coding, proved in [16], asserts that if the decoder has side information Y of uncoded source X, then the entropy of the source, H(X), in the standard separation theorem is replaced by the conditional entropy H(X|Y). Equivalently, the Slepian-Wolf limit in this noisy channel case is H(X|Y)/C, where C≦1 is the channel capacity. An extension to lossy source-channel coding with side information was given in [17].

The output of a syndrome-based Slepian-Wolf encoder are syndrome bits of a channel code, which are for compression, not for error protection. Therefore, when the transmission channel is noisy, following the separation principle, first one channel code should be used to perform Slepian-Wolf compression and then the resulting syndrome bits protected by another channel code against errors introduced by the noisy transmission channel. The syndrome-based approach for SWC can only be used in separate designs of the source and channel coding components. Such a separate design was proposed in [30] based on LDPC codes for SWC and digital fountain LT codes [21] for erasure protection. Although the separation approach is asymptotically optimal, joint designs are expected to perform better in practice.

Since SWC is essentially a channel coding problem [9], it is nature to combine the two channel codes—one for SWC and another for channel coding—into one single channel code for distributed JSCC. This can be achieved with the parity-based approach in SWC, because in contrast to syndrome bits, parity bits protect. Indeed, if the amount of generated parity bits increases above the Slepian-Wolf limit, the extra redundancy can be exploited for protection. We thus view the source-channel coded bits as the parity bits of a systematic channel code and consider an equivalent channel coding problem over two parallel channels. The first channel is the noisy transmission channel through which the output bits of the encoder are transmitted, and it describes the distortion experienced by the parity bits of the code. The second channel is the "virtual" correlation channel between the source (the systematic bits of the channel code) and the side information available at the decoder. This idea was previously exploited in [31, 32, 33, 34, 35] to design practical Slepian-Wolf codes for transmission over binary symmetric, Gaussian, and fading channels.

However, when the actual transmission channel is erasure based, designing a single channel code for joint SWC and erasure protection is difficult because a good candidate code should perform well over a parallel concatenation of the correlation channel, which is in our case a Gaussian channel (see Section 4), and the packet erasure transmission channel. The search for such a good candidate code leads us to Raptor codes [18]. A precode of the Raptor code is a liner systematic (n+r, n) code given by generator matrix $G^p_{n\times(n+r)}$. The encoder first forms an (n+r)-length codeword as $x_s=x\times G^p$. Then, the output symbols are generated as $z=x_s\times S^T$, where S is an r'×(n+r) matrix whose rows are sampled independently from the employed LT code degree distribution [21, 18]. Assuming that the capacity of the packet erasure channel is C, one must have r'≧nH(X|Y)/C, or more precisely, r'≧nH(X|Y)(1+ϵ)/C, where ϵ is the Raptor code overhead. Note that there is not an upper bound on r', since the encoder can generate output symbols until the decoder receives enough to successfully decode; that is, the encoder can extend matrix $S^T$ by generating new columns on the fly. The encoder output vector can be expressed as $z=x\times(G^p\times S^T)$, where the n×r' matrix $G^p\times S^T$ can be seen as a parity matrix of a bigger (n+r', n) systematic code given by the generator matrix $[I_n\ (G^p\times S^T)]$. Decoding starts when nH(X|Y)(1+ϵ)/C bits are received and is done jointly on the whole decoding graph (see details in Section 4).

We point out that a separate design based on concatenating a syndrome-based Slepian-Wolf code C with an LT code and a joint design with a Raptor code based on $C^p$ precoding and an LT code are equivalent if: 1) the employed LT codes in both designs are the same; 2) $H^T=P^p$; 3) all LT parity bits of the Raptor code are connected to the parity bits of $C^p$. Since the joint design based on Raptor codes does not have to be constrained by 3), there is obviously more freedom in the Raptor code construction, leading to improved performance over separate designs.

4 Distributed Joint Source-Channel Coding of Video Using Raptor Codes

The block diagram of the proposed system for distributed JSCC of video is shown in FIG. 3. The video sequence is first encoded at a low bitrate with a standard video coder (H.26L [36] in our experiments) to generate a base layer, which is transmitted to the receiver. At the receiver, the base layer is decoded and reconstructed; we denote by Y the DCT coefficients of the reconstructed base layer, which will play the role of decoder side information. To improve the reconstruction video quality, the encoder then generates enhancement layers using WZC, or more precisely distributed JSCC. The rationale behind this is that, after quantization of the DCT coefficients of the original video sequence, there is still correlation between the obtained quantization indices X and Y, which can be modeled well with a Gaussian "virtual" correlation channel, that is X=Y+N [7], where N is a Gaussian i.i.d. random variable independent of Y. We employ a single Raptor code with IRA precoding (as described in Section IV) not only to compress the stream X by exploiting this correlation, but also to provide erasure protection.

We note that because Raptor codes have not been employed for coding with side information before, there are several new issues with using them for distributed JSCC.

First, in conventional erasure protection coding of k-length binary source sequence $X^k=\{x_1, \ldots, x_k\}$ with Raptor codes, a minimum of $k(1+\epsilon)$ output symbols are needed for successful decoding (with high probability), where $\epsilon$ is the overhead percentage [18, 21]. However, in distributed JSCC, the design goal of the encoder is to guarantee a minimum of $kH(X|Y)(1+\epsilon)$ symbols for successful decoding, where the k-length $Y^k=\{y_1, \ldots, y_k\}$ is the decoder side information.

Second, in contrast to hard-decision decoding of conventional Raptor codes over erasure channels, the decoder side information necessitates iterative soft-decision decoding in distributed JSCC to extract soft information from the Gaussian correlation channel. (By hard-decision decoding, we mean message-passing decoding [37] that passes "hard" information between iterations about whether a node is 0 or 1 and outputs hard decisions. By soft-decision decoding, we mean message-passing decoding [37] that passes "soft" information between iterations but outputs hard decisions.)

The rest of this section describes how to resolve these issues by efficiently combining the received packets with side information Y in the proposed Raptor code design. One point of novelty lies in the choice of IRA (instead of conventional LDPC) precoding, which facilitates soft-decision decoding.

4.1 Encoding

Figure 4:
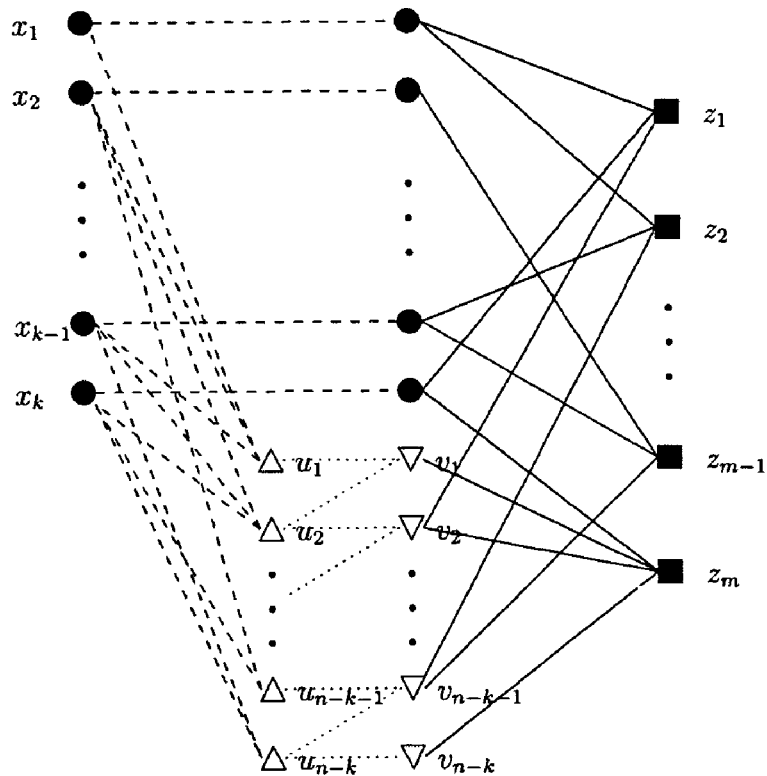
FIG. 4a is a graphical representation of one embodiment of a Raptor encoder including IRA precoding.
FIG. 4b is one embodiment of a bipartite graph of a joint Raptor decoder.
Figure 4:
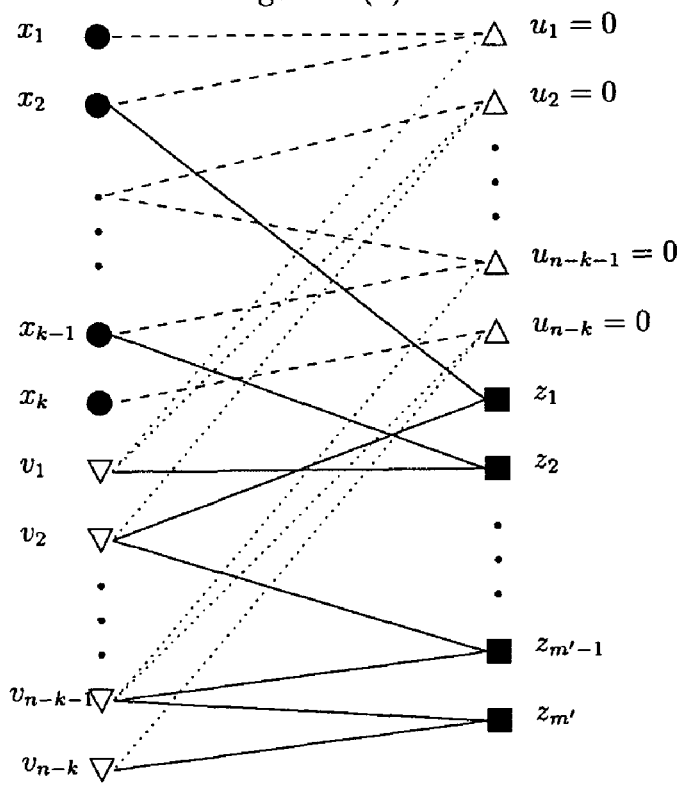

The proposed Raptor encoder with IRA precoding is depicted in FIG. 4 (a). First, the input binary sequence $X^k=\{x_1, \ldots, x_k\}$ is encoded with a systematic IRA precode, resulting in intermediate check symbols $u_1, \ldots, u_{n-k}$ and parity symbols $v_1, \ldots, v_{n-k}$. For $j=1, \ldots, n-k$, $u_j$ is the XOR sum of all input systematic symbols it is connected to, and $v_j$ is computed as $v_j=v_{j-1}\oplus u_j$, with $v_0=0$ [22]. Then, the potentially limitless output stream $z_1, \ldots, z_m, \ldots$ is generated from the n-length sequence $x_1, \ldots, x_k, v_1, \ldots, v_{n-k}$ by encoding with an LT code.

Note that the IRA precode is not employed solely for SWC, but it also facilities protection against erasures. Therefore, it is not obvious that its code rate k/n should be dictated by the Slepian-Wolf limit $H(X|Y)$ by $n-k \geq nH(X|Y)$, as in the separate design that employs the IRA code for SWC and an additional erasure protection code. The optimal IRA code rate now depends not only on the Slepian-Wolf limit (i.e., the correlation between X and Y), but also on the particular bipartite graph of the LT code.

Each LT output symbol $z_i$ is connected randomly to $d_i$ IRA systematic and parity symbols, where $d_i$ is chosen from the LT code degree distribution [21]. In conventional Raptor encoding, systematic and parity symbols of the precode are treated equally in this random selection for LT coding. This means that each LT output symbol is connected with equal probability to any (systematic or parity) IRA symbol—thus all IRA symbols have in average the same degree (the number of connections to output LT symbols, i.e., the same number of parity-check equations involved in). Since the degree of an LT input symbol (IRA symbol) determines how strong it is protected against erasures, all IRA coded symbols in conventional Raptor coding are equally protected.

However, in our system, the decoder side information Y provides a priori knowledge about the IRA systematic symbols, and the decoder does not have such information about the IRA parity symbols. Consequently, if we apply conventional Raptor encoding with equal degrees of all IRA symbols, IRA parity symbols at the decoder would be almost useless since the systematic symbols would be easier recovered directly from the received LT packets due to side information. In order to take full advantage of the IRA parity symbols, we introduce a bias towards selecting IRA parity symbols versus systematic symbols in forming the bipartite graph of the LT code. This is done by selecting IRA parity symbols with probability $p>0.5$ for a given LT output symbol. (Note that in conventional Raptor encoding, $p=0.5$.) This way, we balance the effective realized protection between IRA systematic and parity symbols. The key challenge is to select the optimal p so that the improved protection of the parity symbols compensates presence of the side information for systematic symbols and thus maximizes performance.

The optimal p clearly depends on the IRA code rate, and these two parameters are advantageously considered jointly. In our encoder design, we select p and IRA code rate experimentally. We start with an IRA code whose rate is determined by the Slepian-Wolf limit $H(X|Y)$ as $$\frac{1}{1+H(X/Y)},$$

then p is chosen in our simulations to minimize the overhead percentage $\epsilon$, i.e., the number of symbols $kH(X|Y)(1+\epsilon)$ needed for correct decoding and quick convergence of the overall Raptor code. Given the determined p, we adjust the rate of the IRA precode to further improve the performance. Our experiments show that the Raptor code performance is more sensitive to the choice of p than the IRA precode rate.

4.2 Soft-Decision Decoding

A bipartite graph used for our joint Raptor decoder is shown in FIG. 4 (b). Let m be the number of received symbols and $u_j$ the check sum of r systematic symbols $x_{j_1}, \ldots, x_{j_r}$; then from $v_j=v_{j-1}\oplus u_j$, it follows that $x_{j_1}\oplus \ldots \oplus x_{j_r}\oplus v_{j-1}\oplus v_j=0$. In other words, the intermediate check symbols $u_j$'s can be set to zero and viewed as check sums of the connected systematic symbols $x_{j_1}, \ldots, x_{j_r}$ and IRA parity symbols $v_{j-1}$ and $v_j$. Therefore, we can think of $\tilde{X}^n=\{x_1, \ldots, x_k, v_1, \ldots, v_{n-k}\}$ as the extended sequence of input symbols and $\tilde{Z}^n=\{u_1=0, \ldots, u_{n-k}=0, z_1, \ldots, z_m\}$ as the extended sequence of received symbols. Then decoding of $X^k=\{x_1, \ldots, x_k\}$ is based on the iterative message-passing algorithm [37] on the created bipartite graph in FIG. 4 (b), where variable and check nodes are associated with $\tilde{X}^n$ and $\tilde{Z}^n$, respectively.

The log likelihood ratios (LLR's) for the systematic symbols are computed using the side information $Y^k=\{y_1, \ldots, y_k\}$ (assuming the "virtual" correlation channel between X and Y), and since we have no a priori knowledge of the IRA parity symbols $v_1, \ldots, v_{n-k}$, the LLR's corresponding to them are initially set to zero. In each decoding iteration, messages or LLRs are passed from a variable node $\tilde{x}\in\tilde{X}^n$ to a check node $\tilde{z}\in\tilde{Z}^n$ as follows:

$$msg(\tilde{x} \to \tilde{z}) = \sum_{w \neq \tilde{z}} msg(w \to \tilde{x}) + msg_0(\tilde{x}),$$

where $msg_0(\tilde{x})$ is the initial LLR of the variable node $\tilde{x}$. Then, messages are passed from a check node $\tilde{z}$ back to a variable node $\tilde{x}$ as:

$$\tanh\frac{msg(\tilde{z} \to \tilde{x})}{2} = \tanh\frac{msg_0(\tilde{z})}{2}\prod_{w \neq \tilde{x}}\tanh\frac{msg(w \to \tilde{x})}{2},$$

where $msg_0(\tilde{z})$ is the initial LLR of the check node $\tilde{z}$ (i.e., if $\tilde{z}=0$, then $msg_0(\tilde{z})=+\infty$; otherwise, $msg_0(\tilde{z})=-\infty$).

We emphasize that without the decoder side information $Y^k$, we would need $k(1+\epsilon)$ LT symbols to successfully decode $X^k$ (with high probability) [18]. However, we will show in the next section that by effectively exploiting $Y^k$ in our Raptor code design, we are able to reduce the number of needed LT symbols to $kH(X|Y)(1+\epsilon)$, which corresponds to the theoretical limit [16] plus the overhead due employed LT codes which are not MDS.

5 Experimental Results

In this section we report our experimental results obtained with the standard CIF Foreman and SIF Football sequences. For each sequence, we encode 300 frames at rate 30 frames/second. The base layer is generated with H.26L video coder [36]. 20 frames are grouped and coded as one group of frames (GOF) consisting of an I frame followed by 19 P frames. Enhancement layers are generated using WZC, where the correlation between source X and side information Y is modeled as jointly Gaussian (in the DCT domain). After DCT of the original video (see FIG. 3), we code only the first three transform coefficients (i.e., DC and the first two AC coefficients) using a four-bit nested scalar quantizer (see [7, 9]) to generate four bit planes. The remaining transform coefficients are discarded. The 4×3=12 bit planes are then encoded by 12 different Raptor codes. The IRA precode rate of each Raptor code is determined by the corresponding precomputed Slepian-Wolf limit using the base layer as the decoder side information.

Each IRA code is designed using density evolution with Gaussian approximation [22]; the lengths of the 12 IRA codes for each GOF are the same, but the code lengths for different GOFs are different ranging from 70 to 110 kilobits (Kb) depending on the amount of motion in each GOF. The distribution of the used LT code is from [18]; although this distribution is optimal for the binary erasure channel, it provides good performance for the Gaussian channels as well [26]. Each LT check node is connected to the IRA parity nodes with the bias probability p and to the systematic nodes with probability 1−p. The resulting output bitstreams are grouped into packets of 200 bytes each and sent over packet erasure channel. At the receiver, 100 iterations are used in joint Raptor decoding. We assume error-free decoding if the probability of decoding error is less than $5\times10^{-5}$.

5.1 Coding Performance with Perfect Base Layer

Figure 5:
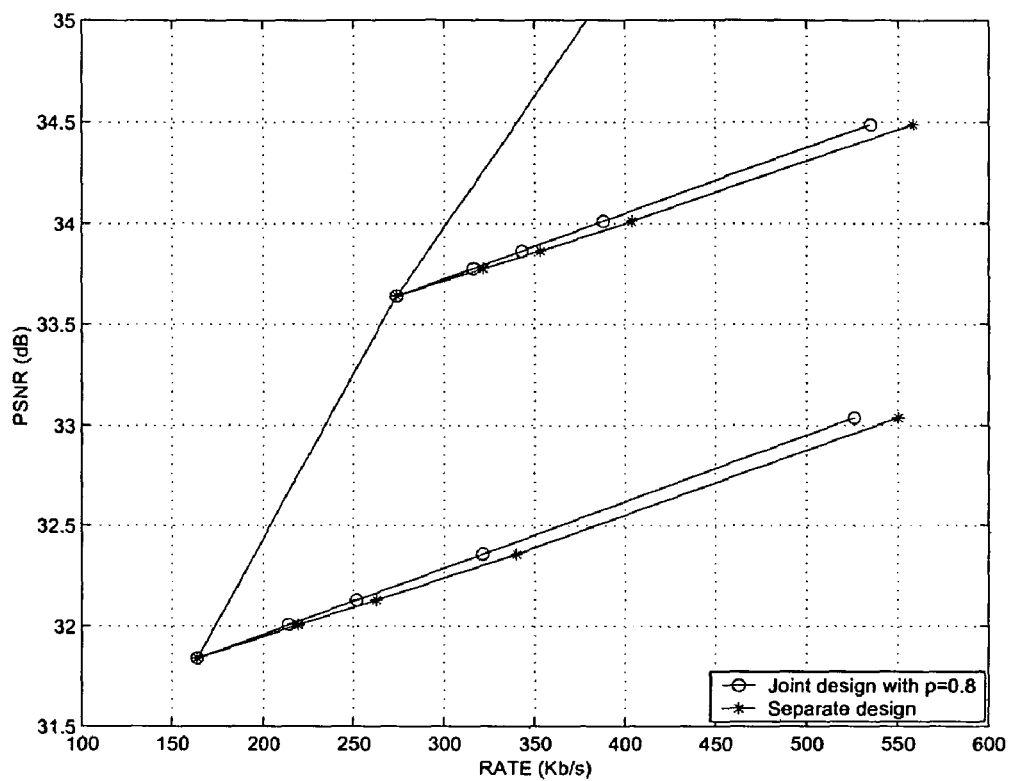
FIGS. 5a and 5b illustrate performance comparisons of one embodiment of a joint Raptor code design vs. one embodiment of a separate design for CIF Foreman (5a) and SIF Football (5b) with packet erasure rate being 0.1. The horizontal axis represents the sum of the rates for H.26L coding and the joint/separate scheme, while the average peak signal-to-ratio (PSNR) over all 300 frames is shown in the vertical axis.
Figure 5:
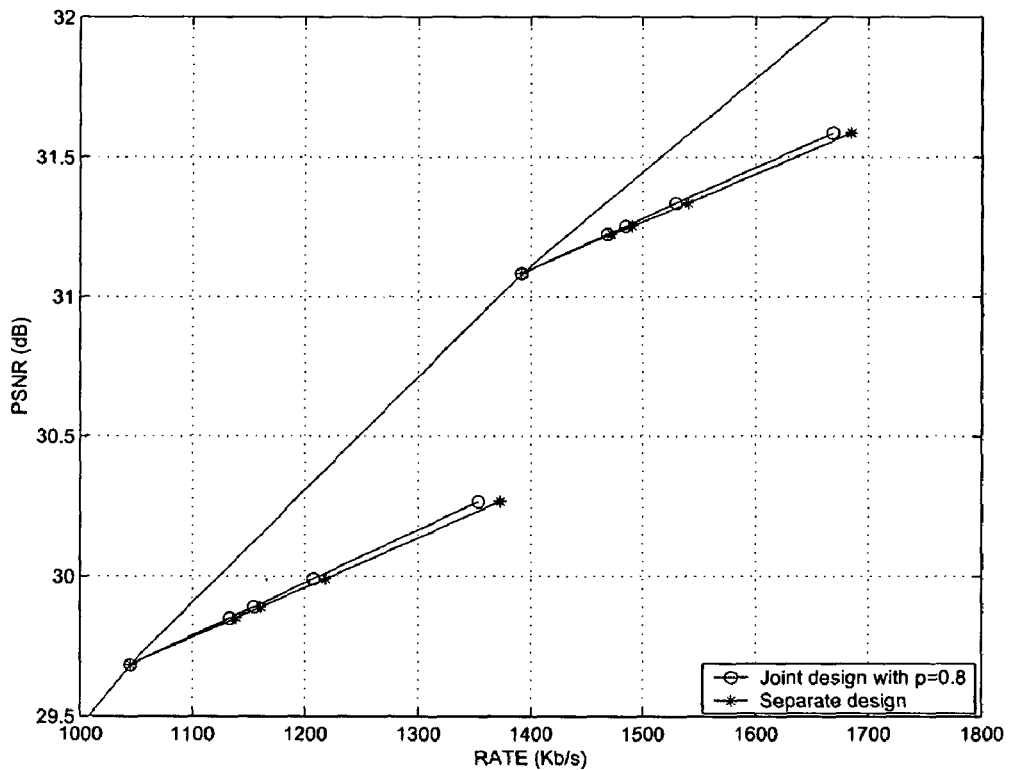

We first assume that the base layer is perfectly reconstructed at the receiver, and compare the proposed cross-layer design based on Raptor codes (with IRA precoding and soft-decision decoding) to the separate design scheme, which resembles the LDPC+LT design of [30], but instead of LDPC codes used in [30], it exploits the IRA code for SWC together with conventional LT coding for erasure protection. The obtained PSNR averaged over all 300 frames for the two video sequences and two different bitrates of the base layer as a function of the total transmission rate is shown in FIG. 5. The enhancement layers are transmitted over packet erasure channel with packet loss rate 0.1. For our joint design, we report the best results optimized at p=0.8 for the bias probability. The four rate-distortion points for each base layer bitrate correspond to the average PSNR after consecutively decoding packets generated for each of the four bit planes. It is seen from the figure that to achieve the same average PSNR, the number of received packets with the joint Raptor code design is for 7-9% and 5-6% less than that with the separate design, for the CIF Foreman and SIF Football, respectively.

As theoretically predicted, our proposed joint design improves the performance of the separate design by taking the advantages of the Raptor codes over the LT codes in conventional erasure protection coding. Indeed, in LT coding, each parity-check symbol is connected randomly to a predetermined number of information symbols. In conventional channel coding of $X^k$, it is possible that an information symbol is not connected to any of the received $k(1+\epsilon)$ LT parity-check symbols. It cannot then be recovered, although the probability of this event decreases as k increases. On the other hand, in our proposed joint design (as in Raptor coding), the additional connections to the information symbols (realized via precoding) reduce this probability.

5.2 Coding Performance with Corrupted Base Layer

In this subsection, we investigate robustness to the reconstruction errors in the base layer. The base layer and enhancement layers are generated by encoding the first 20 frames (one GOF) of the CIF Foreman and SIF Football sequences and transmitted over the same packet loss channel. To illustrate improved robustness of Wyner-Ziv video coding over classic FGS video, besides the two designs (joint and separate) described in the previous subsection, we included another separate scheme based on H.26L FGS [38] video coding and erasure protection. All three schemes generate the base layer at the same bitrate and protect it with MDS RS coding (RS codes are used purely to simplify implementation, and no conceptual difference will occur by replacing them with LT codes). To estimate the impact of MDS coding, the enhancement layers in the two separate designs are protected with either LT codes or with MDS RS codes. Thus, five different schemes are tested: 1) the proposed cross-layer design based on Raptor codes (with IRA precoding and LT codes), 2) the separate IRA+LT design, 3) the separate IRA+RS design, 4) H.26L FGS+LT, and 5) H.26L FGS+RS. (Note that designs 2 and 3 exploit IRA coding as part of Wyner-Ziv video compression.)

The base layer is encoded at 334.2 Kb/s and 1762 Kb/s, for the CIF Foreman and SIF Football sequence, respectively, where 10% of the rate is used for RS parity symbols; that is, an RS code of the rate 9/10 is employed for erasure protection of the base layer. The bitrate of the enhancement layer is fixed at 281.1 Kb/s and 492.7 Kb/s, for the CIF Foreman and SIF Football sequence, respectively. The generated packet streams are transmitted over a packet erasure channel where packet losses are introduced randomly with probability q.

In all experiments the LT code rate in schemes 2 and 4 is chosen to be 0.82 so that the probability of the LT decoding success is high at packet loss rate 0.1. The code rates of the IRA code and LT code in scheme 1 are kept the same as in schemes 2 and 4 for a fair comparison, and the bias probability p in scheme 1 is set to be 0.8 as in the previous subsection. When RS codes are used, we employed the multiple description-based Priority Encoding Transmission system of [39], which provides the most effective protection (at the expense of increased complexity and delay). The optimal source-channel symbol allocation (the RS code rates) is determined using the fast unequal error protection algorithm of [40] at packet loss rate q=0.1.

Figure 6:
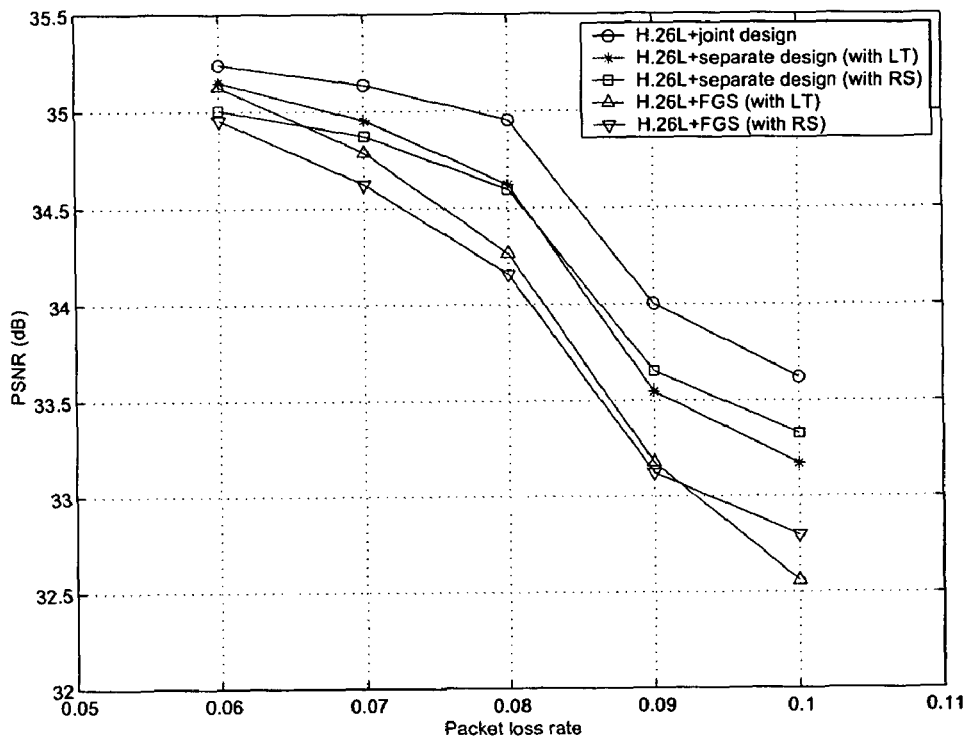
FIGS. 6a and 6b illustrate performance comparisons of a joint Raptor code design, a separate IRA+LT design, a separate IRA+RS design, H.26L FGS+LT, and H.26L+RS for CIF Foreman (6a) and SIF Football (6b), with packet erasure rate 0.06~0.10 at the same total transmission rate. All schemes are designed for packet loss rate of 0.1.
Figure 6:
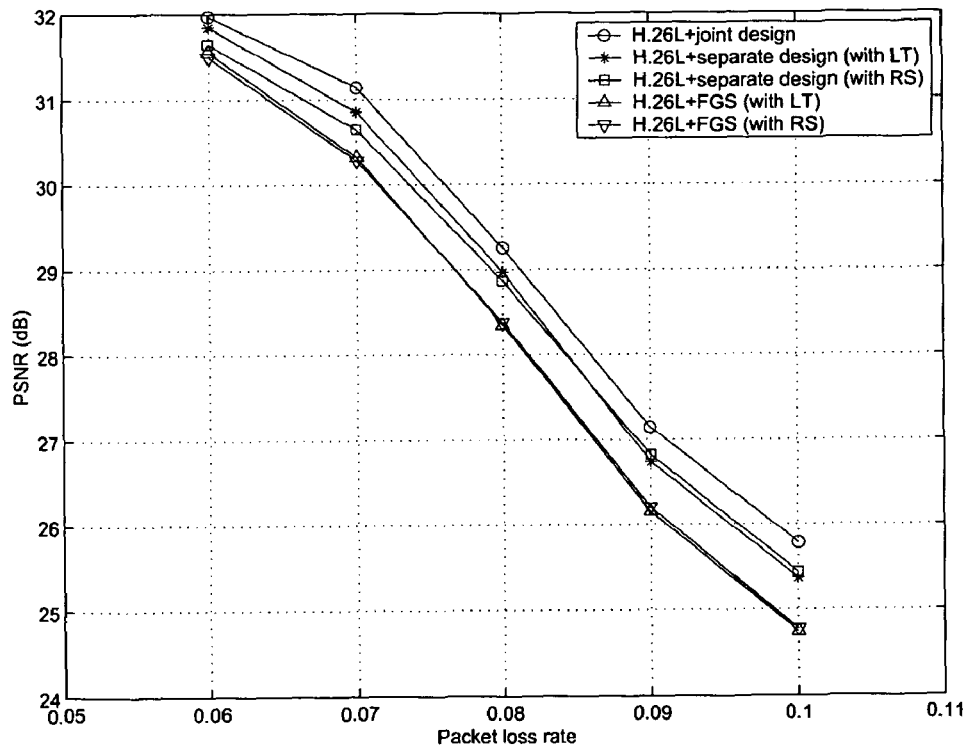

To evaluate robustness to the optimization mismatch (e.g., due to unknown channel statistics at the encoder), all five schemes are designed assuming channel packet loss rate 0.1 and tested at five different loss rates q=0.06, 0.07, 0.08, 0.09, and 0.1. The obtained average PSNR over all 20 frames and one hundred simulations as a function of q is shown in FIG. 6. Note that after decoding, there are still residual errors in the base layer. For example, for the CIF Foreman sequence, residual packet loss rates in the base layer were 0.47%, 1.03%, 2.13%, 3.41%, and 5.00%, at q=0.06, 0.07, 0.08, 0.09, and 0.1, respectively. (A simple error concealment is done during decoding.) For the enhancement layers, in schemes 2 and 3, the whole layer where the first unrecovered syndrome appears is discarded together with all successive layers. This is done because Slepian-Wolf decoding cannot be performed with corrupted syndromes; therefore one must ensure that the entire bitstream fed to the Slepian-Wolf decoder is error free. From the figure we can see that the joint scheme performs uniformly better than all separate design schemes (up to 1.2 dB and 1 dB, for the CIF Foreman and SIF Football, respectively). The second conclusion from the figure is that the distributed coding schemes (schemes 1, 2, and 3) are more robust than FGS schemes in general, showing that employed WZC is capable of alleviating the effect of error drifting associated with standard FGS coding. We can also observe that the schemes with LT codes give a better reconstruction quality than the corresponding schemes based on RS codes at low packet loss rates; we explain this by the fact that the schemes 3 and 5 are overprotected, since they are optimized for q=0.1; that is, the LT code rates in schemes 2 and 4 are higher that the RS code rates in schemes 3 and 5. On the other hand, the LT-based schemes provide slightly worse quality at high packet loss rates (where the optimization is performed), due to MDS property of RS codes.

6 Conclusion

We have extended beyond recent works on channel coding for distributed source coding to channel coding for distributed JSCC and expanded the powerful concept of digital fountain codes for erasure protection in the process of accommodating the decoder side information. We have also developed a practical distributed JSCC scheme that exploits a single digital fountain Raptor code for both compression and protection for transmission over erasure channels. With this solution, we are able to reflect the advantages of Raptor codes over LT codes to the distributed coding case. Thus, the joint design based on our novel distributed JSCC paradigm is superior to designs where compression and protection coding are treated separately. In addition, while the separate design scheme has to wait until enough number of LT encoded symbols are collected for decoding of all Slepian-Wolf coded syndromes, in the proposed scheme, the decoding error gradually decreases as more encoded symbols become available. Finally, we point out that our distributed video coder functions as a Wyner-Ziv video coder with near-optimal performance when there are no packet loss. It can thus be regarded as an error-robust Wyner-Ziv video coder.

References

[1] Q. Xu, V. Stanković, and Z. Xiong, "Distributed joint source-channel coding for video using Raptor codes," *Proc. DCC'05 Data Compression Conference*, Snowbird, Utah, March 2005.

[2] T. Wiegand, G. Sullivan, G. Bjintegaard, and A. Luthra, "Overview of the H.264/AVC video coding standard," *IEEE Trans. Circuits and Systems for Video Tech.*, vol. 13, pp. 560-576, July 2003.

[3] S. Pradhan, J. Kusuma, and K. Ramchandran, "Distributed compression in a dense microsensor network," *IEEE Signal Processing Magazine*, vol. 19, pp. 51-60, March 2002.

[4] R. Puri and K. Ramchandran, "PRISM: A new robust video coding architecture based on distributed compression principles," *Proc. Allerton Conf. Communication, Control and Computing*, Monticello, Ill., October 2002.

[5] A. Sehgal, A. Jagmohan, and N. Ahuja, "Wyner-Ziv coding of video: applications to error resilience," *IEEE Trans. Multimedia*, vol. 6, pp. 249-258, April 2004.

[6] B. Girod, A. Aaron, S. Rane, and D. Rebollo-Monedero, "Distributed video coding," *Proc. of the IEEE*, vol. 93, pp. 71-83, January 2005.

[7] Q. Xu and Z. Xiong, "Layered Wyner-Ziv video coding," *IEEE Trans. Image Processing*, to appear.

[8] C. Tang, N. Cheung, A. Ortega, and C. Raghavendra, "Efficient inter-band prediction and wavelet based compression for hyperspectral imagery: a distributed source coding approach," *Proc. DCC'05 Data Compression Conference*, Snowbird, Utah, March 2005.

[9] Z. Xiong, A. D. Liveris, and S. Cheng, "Distributed source coding for sensor networks," *IEEE Signal Processing Magazine*, vol. 21, pp. 80-94, September 2004.

[10] J. Slepian and J. Wolf, "Noiseless coding of correlated information sources," *IEEE Trans. Inform. Theory*, vol. 19, pp. 471-480, July 1973.

[11] A. Wyner and J. Ziv, "The rate-distortion function for source coding with side information at the decoder," *IEEE Trans. Inform. Theory*, vol. 22, pp. 1-10, January 1976.

[12] T. Berger, "Multiterminal source coding," *The Inform. Theory Approach to Communications*, G. Longo, Ed., New York: Springer-Verlag, 1977.

[13] V. Stanković, A. D. Liveris, Z. Xiong, and C. N. Georghiades, "On code design for the Slepian-Wolf problem and lossless multiterminal networks," *IEEE Trans. Inform. Theory*, vol. 52, pp. 1495-1507, April 2006.

[14] Y. Sterinberg and N. Merhav, "On successive refinement for the Wyner-Ziv problem," *IEEE Trans. Inform. Theory*, vol. 50, pp. 1636-1654, August 2004.

[15] W. Li, "Overview of fine granularity scalability in MPEG-4 video standard," *IEEE Trans. Circuits and Systems for Video Tech.*, vol. 11, pp. 301-317, March 2001.

[16] S. Shamai and S. Verdu, "Capacity of channels with side information," *European Trans. Telecommunications*, vol. 6, pp. 587-600, September-October 1995.

[17] S. Shamai, S. Verdu, and R. Zamir, "Systematic lossy source/channel coding," *IEEE Trans. Inform. Theory*, vol. 44, pp. 564-579, March 1998.

[18] A. Shokrollahi, "Raptor codes," *IEEE Trans. Inform. Theory*, vol. 52, pp. 2551-2567, June 2006.

[19] M. Luby, M. Watson, T. Gasiba, T. Stockhammer, and W. Xu, "Raptor codes for reliable download delivery in wireless broadcast systems," *Consumer Communications and Networking Conference*, vol. 1, pp. 192-197, January 2006.

[20] M. Mitzenmacher, "Digital fountains: a survey and look forward," *Proc. ITW'04 IEEE Information Theory Workshop*, San Antonio, Tex., October 2004.

[21] M. Luby, "LT codes," *Proc. 43rd IEEE Symp. on the Foundations of Computer Science*, pp. 271-280, Vancouver, BC, Canada, November 2002.

[22] H. Jin, A. Khandekar, and R. McEliece, "Irregular repeat-accumulate codes," *Proc. 2nd Intl. Symp. Turbo codes and related topics*, pp. 1-8, September 2000.

[23] N. Rahnavard and F. Fekri, "Finite-length unequal error protection rateless codes: design and analysis," *Proc. IEEE Globecom'05*, Saint Louis, Mo., November 2005.

[24] J. Bloemer, M. Kalfane, M. Karpinski, R. Karp, M. Luby, and D. Zuckerman, "An XOR-based erasure-resilient coding scheme," *Int. Computer Science Institute Technical Report*, TR-95-48, 1995.

[25] M. Luby, M. Mitzenmacher, M. Shokrollahi, and D. Spielman, "Efficient erasure correcting codes," *IEEE Trans. Inform. Theory*, vol. 47, pp. 569-584, February 2001.

[26] R. Palanki and J. S. Yedidia, "Rateless codes on noisy channels," *Proc. CISS'04 38th Annual Conference on Information Science and Systems*, Princeton, N.J., March 2004.

[27] R. Zamir, S. Shamai, and U. Erez, "Nested linear/lattice codes for structured multiterminal binning," *IEEE Trans. Inform. Theory*, vol. 48, pp. 1250-1276, June 2002.

[28] A. Wyner, "Recent results in the Shannon theory," *IEEE Trans. Inform. Theory*, vol. 20, pp. 2-10, January 1974.

[29] T. Cover and J. Thomas, *Elements of Information Theory*, New York:Wiley, 1991.

[30] Q. Xu, V. Stanković, and Z. Xiong, "Wyner-Ziv video compression and fountain codes for receiver-driven layered multicast," *Proc. PCS'04 Picture Coding Symposium*, San Francisco, Calif., December 2004.

[31] A. Aaron and B. Girod, "Compression with side information using turbo codes," *Proc. DCC'02 Data Compression Conference*, Snowbird, Utah, April 2002.

[32] J. Garcia-Frias, "Joint source-channel decoding of correlated sources over noisy channels," *Proc. DCC'01 Data Compression Conference*, Snowbird, Utah, March 2001.

[33] P. Mitran and J. Bajcsy, "Turbo source coding: a noise-robust approach to data compression," *Proc. DCC'02 Data Compression Conference*, Snowbird, Utah, April 2002.

[34] A. D. Liveris, Z. Xiong, and C. N. Georghiades, "Joint source-channel coding of binary sources with side information at the decoder using IRA codes," *Proc. MMSP'02 IEEE Workshop on Multimedia Signal Processing*, St. Thomas, U.S. Virgin Islands, December 2002.

[35] M. Sartipi and F. Fekri, "Source and channel coding in wireless sensor networks using LDPC codes," *Proc. First Annual IEEE Communications Society Conf. on Sensor Communications and Networks*, Santa Clara, Calif., October 2004.

[36] T. Wiegand, "H.26L test model long-term number 9 (tml-9) draft0," ITU_T Video Coding Experts Group, VCEG-N83d1, December 2001.

[37] F. Kschischang, B. Frey, and H. Loeliger, "Factor graphs and the sum-product algorithm," *IEEE Trans. Inform. Theory*, vol. 47, pp. 498-519, February 2001.

[38] Y. He, R. Yan, F. Wu, and S. Li, "H.26L-based fine granularity scalable video coding," ISO/IEC MPEG 58th meeting, M7788, Pattaya, Thailand, December 2001.

[39] A. Albanese, J. Blömer, J. Edmonds, M. Luby, and M. Sudan, "Priority encoding transmission", *IEEE Trans. Inform. Theory*, vol. 42, pp. 1737-1744, November 1996.

[40] V. Stanković, R. Hamzaoui, and Z. Xiong, "Real-time error protection algorithms of embedded codes for packet erasure and fading channels," *IEEE Trans. Circuits and Systems for Video Tech.*, vol. 14, pp. 1064-1072, August 2004.

What is claimed is:

1. A non-transitory computer-readable storage medium which stores program instructions executable by a computer system to cause the computer system to:
perform energy-concentrating transform operations on video data to obtain transformed data;
perform nested scalar quantization on the transformed data to generate blocks of coset indices;
encode selected bit planes of the blocks of coset indices to determine corresponding bit streams, wherein said encoding includes encoding each of the selected bit planes of each of the blocks with a corresponding encoder that includes a corresponding irregular repeat accumulate (IRA) subencoder configured to index bins using parity check bits, and a corresponding Luby transform (LT) subencoder; and
transmit the bit streams to a decoder over a channel.

2. The storage medium of claim 1, wherein the energy-concentrating transform operations are discrete cosine transform (DCT) operations, wherein each of the blocks includes values of a corresponding frequency coefficient from each of the DCT operations.

3. The storage medium of claim 1, wherein the channel is a wireless channel.

4. The storage medium of claim 1, wherein each LT subencoder operates based on a graph having input nodes, output nodes and connections between the input nodes and output nodes, wherein a first subset of the input nodes receive bits from the corresponding bit plane of the corresponding block, wherein a second subset of the input nodes receive parity bits from the corresponding IRA subencoder, wherein each output node has a larger number of connections to input nodes of the second subset than to input nodes of the first subset.

5. The storage medium of claim 1, wherein the data size of each bit stream is the minimum data size for error-free decoding over a space of possible rates for the corresponding IRA subencoder and possible connection weights p for the corresponding LT subencoder.

6. The storage medium of claim 1, wherein each of the IRA subencoders is configured to perform both source coding and error protection coding on the corresponding bit plane of the corresponding block of coset indices, wherein the channel is a noisy channel.

7. The storage medium of claim 1, wherein the program instructions are executable by the computer system to:
encode a reduced-quality version of the video data to generate base layer data; and
transmit the base layer data to the decoder.

8. The storage medium of claim 1, wherein the energy-concentrating transform operations are discrete cosine transform (DCT) operations.

9. The storage medium of claim 1, wherein the program instructions are executable by the computer system to:
transmit a subset of the bit streams to a second decoder over a second channel.

10. A system comprising:
a transform unit configured to perform energy-concentrating transform operations on video data to obtain transformed data;
a quantization unit configured to perform nested scalar quantization on the transformed data to generate blocks of coset indices; and
a plurality of encoder units each configured to encode a respective bit plane of a respective block of the coset indices in order to generate a respective output bit sequence, wherein each of the encoder units includes an irregular repeat accumulate (IRA) subencoder configured to index bins using parity check bits, and a Luby transform (LT) subencoder.

11. The system of claim 10, wherein the energy-concentrating transform operations are discrete cosine transform (DCT) operations, wherein each of the blocks includes values of a corresponding frequency coefficient from each of the DCT operations.

12. The system of claim 10 further comprising a transmitter configured to transmit the output bit sequences to a decoder over a channel.

13. The system of claim 12, wherein the channel is a wireless channel.

14. The system of claim 10, wherein each LT subencoder is configured to operate based on a graph having input nodes, output nodes and connections between the input nodes and output nodes, wherein a first subset of the input nodes are configured to receive bits from the corresponding bit plane of the corresponding block, wherein a second subset of the input nodes are configured to receive parity bits from the corresponding IRA subencoder, wherein each output node has a larger number of connections to input nodes of the second subset than to input nodes of the first subset.

15. The system of claim 10, wherein the data size of each bit sequence is the minimum data size for error-free decoding over a space of possible rates for the corresponding IRA subencoder and possible connection weights p for the corresponding LT subencoder.

16. The system of claim 10, wherein each of the IRA subencoders is configured to perform both source coding and error protection coding on the corresponding bit plane of the corresponding block of coset indices, wherein the channel is a noisy channel.

17. The system of claim 10, wherein the system is implemented in an integrated circuit.

18. The system of claim 10 further comprising a video encoder configured to encode a reduced-quality version of the video data to generate base layer data.

19. A computer system comprising:
a processor; and
a memory that stores at least program instructions, wherein the program instructions are executable by the processor to:
perform energy-concentrating transform operations on video data to obtain transformed data;
perform nested scalar quantization on the transformed data to generate blocks of coset indices;
encode selected bit planes of the blocks of coset indices to determine corresponding bit streams, wherein said encoding includes encoding each of the selected bit planes of each of the blocks with a corresponding raptor encoder which includes a corresponding irregular repeat accumulate (IRA) precoder configured to index bins using parity check bits; and
transmit the bit streams to a decoder over a channel.

20. The computer system of claim 19, wherein each raptor encoder also includes a corresponding Luby transform (LT) encoder, wherein each LT encoder operates based on a graph having input nodes, output nodes and connections between the input nodes and output nodes, wherein a first subset of the input nodes receive bits from the corresponding bit plane of the corresponding block, wherein a second subset of the input nodes receive parity bits from the corresponding IRA precoder, wherein each output node has a larger number of connections to input nodes of the second subset than to input nodes of the first subset.

21. The computer system of claim 19, wherein the data size of each bit stream is the minimum data size for error-free decoding over a space of possible rates for the corresponding IRA precoder and possible connection weights p for the corresponding LT encoder.

22. The computer system of claim 19, wherein said transmitting the bit streams to the decoder over a channel includes transmitting the bit streams through a computer network.

23. The computer system of claim 19, wherein the channel is a wireless channel.

24. A non-transitory computer-readable storage medium which stores program instructions executable by a computer system to cause the computer system to:
receive input data from a channel, wherein the input data corresponds to encoded bit streams generated by an encoding system configured to:
perform energy-concentrating transform operations on video data to obtain transformed data;
perform nested scalar quantization on the transformed data to generate blocks of coset indices; and
encode selected bit planes of the blocks of coset indices using a plurality of encoders to determine said encoded bit streams, wherein each of the encoders includes an irregular repeat accumulate (IRA) subencoder configured to index bins using parity check bits, and a Luby transform (LT) subencoder;
iteratively decode the input data, using side information, to obtain estimates for the blocks of coset indices; and
generate an estimate for the video data using the estimates for the blocks of coset indices and the side information.

25. The storage medium of claim 24, wherein said iteratively decoding uses a plurality of graphs, wherein each of the graphs corresponds to one of the encoders, wherein each of the graphs is a bipartite graph having input nodes and output nodes and no intermediate nodes, wherein the input nodes are directly connected to the output nodes.

26. The storage medium of claim 24, wherein the program instructions are further executable to:
receive base layer data from the channel; and
decode the base layer data to obtain the side information.

27. The storage medium of claim 24, wherein the channel is wireless channel.

28. A decoding system, comprising:
a receiver configured to receive input data from a channel, wherein the input data corresponds to encoded bit streams generated by an encoding system configured to:
perform energy-concentrating transform operations on video data to obtain transformed data;
perform nested scalar quantization on the transformed data to generate blocks of coset indices; and
encode selected bit planes of the blocks of coset indices using a plurality of encoders to determine said encoded bit streams, wherein each of the encoders includes an irregular repeat accumulate (IRA) subencoder configured to index bins using parity check bits, and a Luby transform (LT) subencoder;
a decoding unit configured to iteratively decode the input data, using side information, to obtain estimates for the blocks of coset indices; and
an estimation unit configured to generate an estimate for the video data using the estimates for the blocks of coset indices and the side information.

29. The system of claim 28, wherein said decoding unit uses a plurality of graphs to iteratively decode the input data, wherein each of the graphs corresponds to one of the encoders, wherein each of the graphs includes input nodes and output nodes and no intermediate nodes, wherein the input nodes are directly connected to the output nodes.

30. The system of claim 28, wherein the receiver is further configured to receive base layer data from the channel, wherein the system further comprises a video decoder configured to decode the base layer data to obtain the side information.

31. The system of claim 28, wherein the channel is a wireless channel.

32. A computer system comprising:
a processor; and
a memory that stores at least program instructions, wherein the program instructions are executable by the processor to:
receive input data from a channel, wherein the input data corresponds to encoded bit streams generated by an encoding system configured to: (a) perform energy-concentrating transform operations on video data to obtain transformed data; (b) perform nested scalar quantization on the transformed data to generate blocks of coset indices; and (c) encode selected bit planes of the blocks of coset indices using a plurality of raptor encoders to determine said encoded bit streams, wherein each of the raptor encoders includes a respective irregular repeat accumulate (IRA) precoder configured to index bins using parity check bits;

iteratively decode the input data, using side information, to obtain estimates for the blocks of coset indices; and generate an estimate for the video data using the estimates for the blocks of coset indices and the side information.

33. The computer system of claim 32, wherein said iteratively decoding uses a plurality of graphs, wherein each of the graphs corresponds to one of the raptor encoders, wherein each of the graphs has input nodes and output nodes and no intermediate nodes, wherein the input nodes are directly connected to the output nodes.

34. The computer system of claim 32, wherein the program instructions are further executable to implement:

receiving base layer data from the channel; and
decoding the base layer data to obtain the side information.

35. A method, comprising:

performing, by the computing system, energy-concentrating transform operations on video data to obtain transformed data;

performing, by the computing system, nested scalar quantization on the transformed data to generate blocks of coset indices;

encoding, by the computing system, selected bit planes of the blocks of coset indices to determine corresponding bit streams, wherein said encoding includes encoding each of the selected bit planes of each of the blocks with a corresponding encoder that includes a corresponding irregular repeat accumulate (IRA) subencoder configured to index bins using parity check bits, and a corresponding Luby transform (LT) subencoder; and transmitting the bit streams to a decoder over a channel.

36. A method, comprising:

receiving at a computing system including at least one computing device input data from a channel, wherein the input data corresponds to encoded bit streams generated by an encoding system configured to:

perform energy-concentrating transform operations on video data to obtain transformed data;

perform nested scalar quantization on the transformed data to generate blocks of coset indices; and encode selected bit planes of the blocks of coset indices using a plurality of encoders to determine said encoded bit streams, wherein each of the encoders includes an irregular repeat accumulate (IRA) subencoder configured to index bins using parity check bits, and a Luby transform (LT) subencoder;

iteratively decoding the input data, using side information, to obtain estimates for the blocks of coset indices; and generating an estimate for the video data using the estimates for the blocks of coset indices and the side information.

\* \* \* \* \*

UNITED STATES PATENT AND TRADEMARK OFFICE
CERTIFICATE OF CORRECTION

PATENT NO. : 8,315,306 B2
APPLICATION NO. : 11/517942
DATED : November 20, 2012
INVENTOR(S) : Xu et al.

Page 1 of 1

It is certified that error appears in the above-identified patent and that said Letters Patent is hereby corrected as shown below:

In the Specifications

In Column 13, Line 28, delete "preceding," and insert -- precoding, --, therefor.

Signed and Sealed this
Fourth Day of June, 2013

Teresa Stanek Rea
*Acting Director of the United States Patent and Trademark Office*